(12) United States Patent
Tsorng et al.

(10) Patent No.: US 10,939,579 B2
(45) Date of Patent: Mar. 2, 2021

(54) COMPACT FAN STRUCTURE

(71) Applicant: QUANTA COMPUTER INC., Taoyuan (TW)

(72) Inventors: Yaw-Tzorng Tsorng, Taoyuan (TW); Chun Chang, Taoyuan (TW); Cheng-Chieh Weng, Taoyuan (TW); Chih-Hao Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/237,046

(22) Filed: Dec. 31, 2018

(65) Prior Publication Data

US 2020/0068742 A1 Feb. 27, 2020

Related U.S. Application Data

(60) Provisional application No. 62/723,256, filed on Aug. 27, 2018.

(51) Int. Cl.
| | |
|---|---|
| H05K 7/20 | (2006.01) |
| F24F 7/02 | (2006.01) |
| F24F 7/06 | (2006.01) |
| F24F 7/013 | (2006.01) |
| F04D 29/56 | (2006.01) |
| F04D 29/66 | (2006.01) |
| F04D 29/70 | (2006.01) |

(52) U.S. Cl.
CPC ....... *H05K 7/20172* (2013.01); *F04D 29/703* (2013.01); *H05K 7/20736* (2013.01)

(58) Field of Classification Search
CPC ...... H05K 7/20; F24F 7/02; F24F 7/06; F24F 7/013; F04D 29/56; F04D 29/66

USPC ............. 361/695; 415/126, 148; 416/247 R; 417/423.14; 354/285, 341, 353, 354; 454/285, 341, 353, 354

See application file for complete search history.

(56) References Cited

U.S. PATENT DOCUMENTS 4,084,491 A * 4/1978 Spotts ..................... F04D 25/10
                                                   415/125
4,867,495 A * 9/1989 Nakamura .............. E05B 83/36
                                                   292/336.3

(Continued)

FOREIGN PATENT DOCUMENTS

CN          201611461 U    10/2010
CN          103140107 A     6/2013

(Continued)

OTHER PUBLICATIONS

Extended European Search Report for EP Application No. 19179629.1, dated Nov. 29, 2019.

(Continued)

*Primary Examiner* — Xiaoliang Chen
(74) *Attorney, Agent, or Firm* — Nixon Peabody LLP

(57) ABSTRACT

A fan guard connector is provided. The fan guard connector includes a fan guard structure configured to be secured to a cooling system. The fan guard connector also includes a lever structure connected to the fan guard structure by a pivot element. The lever structure is configured to rotate between an engaged and a disengaged position. The fan guard connector also includes a connector member configured to secure the lever structure to the fan guard structure in the engaged position.

20 Claims, 8 Drawing Sheets

(56) References Cited

U.S. PATENT DOCUMENTS

| | | | | |
|---|---|---|---|---|
| 5,002,462 | A * | 3/1991 | Janisse | F04D 29/703 416/247 R |
| 9,303,887 | B1 * | 4/2016 | Chwala | F24F 13/32 |
| 9,551,499 | B1 * | 1/2017 | Chwala | F24F 13/32 |
| 10,240,615 | B1 * | 3/2019 | Kho | F04D 29/703 |
| 2008/0113611 | A1 * | 5/2008 | Chwala | F24F 7/025 454/341 |
| 2008/0145246 | A1 * | 6/2008 | Lee | F04D 25/14 417/423.14 |
| 2010/0039769 | A1 * | 2/2010 | Saisila | E05C 7/06 361/679.58 |
| 2010/0258279 | A1 * | 10/2010 | Cao | H01L 23/467 165/104.34 |
| 2012/0148387 | A1 * | 6/2012 | Labrecque | F04D 25/14 415/148 |
| 2012/0149294 | A1 * | 6/2012 | Labrecque | A01K 1/0052 454/353 |
| 2013/0017775 | A1 * | 1/2013 | Chwala | F24F 7/025 454/354 |
| 2014/0205430 | A1 | 7/2014 | Chang et al. | |
| 2015/0351280 | A1 * | 12/2015 | Gonzalez Inda | H05K 7/20172 361/695 |
| 2016/0157380 | A1 * | 6/2016 | Kull | H05K 7/20581 211/26 |
| 2016/0252263 | A1 * | 9/2016 | Chwala | F24F 13/32 454/354 |
| 2016/0353591 | A1 | 12/2016 | Chen et al. | |
| 2018/0209672 | A1 * | 7/2018 | Chwala | F24F 7/025 |
| 2019/0073006 | A1 * | 3/2019 | Chang | G06F 1/206 |
| 2019/0219058 | A1 * | 7/2019 | Chen | G06F 1/206 |

FOREIGN PATENT DOCUMENTS

| | | |
|---|---|---|
| CN | 103699194 A | 4/2014 |
| JP | H01112798 A | 5/1989 |
| JP | 2000340974 A | 12/2000 |
| JP | 2001102770 A | 4/2001 |
| JP | 2011222730 A | 11/2011 |

OTHER PUBLICATIONS

JP Office Action for Application No. 2019-132197, dated Aug. 4, 2020, w/ First Office Action Summary.
CN Office Action for Application No. 201910417612.3, dated Dec. 2, 2020, w/ First Office Action Summary.
CN Office Action for Application No. 201910417612.3, dated Dec. 2, 2020, w/ First Office Action.

* cited by examiner

COMPACT FAN STRUCTURE

CROSS REFERENCE TO RELATED APPLICATIONS

This application claims priority under 35 U.S.C. § 119 to U.S. Provisional Application No. 62/723,256, entitled "The Minimize Fan Structure For Dimension Restriction," and filed on Aug. 27, 2018. The contents of that application are hereby incorporated by reference in their entirety.

FIELD OF THE INVENTION

This application relates to cooling systems, and more particularly to a cooling system with a compact design.

BACKGROUND

Computer server systems are commonly mounted in specific configurations on a server rack. Specifically, the server rack can house a number of computing modules, such as server trays, server chassis, server sleds, server blades, etc., each stacked on top of one another. In this way, the server rack allows for efficient vertical arrangement of the computing modules. Each computing module typically includes computer servers that contains hundreds of computer server components. For example, a typical computing module can include hardware circuitry for processing, storage devices, network controllers, disk drives, cable ports, power supplies, etc. All of these electronic components tend to generate heat when operating. The computing modules are compacted in high density within the rack server which compounds to create an even higher generation of heat.

As a result, fans are also mounted in the rack server to move air from the front of a chassis enclosure, through the computing modules and electronic components, to the back of the chassis enclosure. The flow of air through the chassis enclosure is essential for preventing overheating of the electronic components. However, the fans are confined to a limited space. Accordingly, there is a significant interest in increasing the number of fans to improve the overall fan performance for the computer server systems.

SUMMARY

Embodiments of the disclosure concern a fan guard connector. The fan guard connector includes a fan guard structure configured to be secured to a cooling system. The fan guard connector also includes a lever structure connected to the fan guard structure by a pivot element. The lever structure is configured to rotate between an engaged and a disengaged position. The fan guard connector also includes a connector member configured to secure the lever structure to the fan guard structure in the engaged position. In the engaged position, the lever structure engages with a server device to secure the cooling system in place.

In some embodiments of the disclosure, the fan guard structure can include a protruding element configured to provide clearance for a spinner fairing of the cooling system. The connector member can include a turning mechanism configured to posture between a locked and an unlocked position. In some embodiments of the disclosure, when the lever structure is in the engaged position, the turning mechanism is also in the locked position. In some embodiments, the lever structure can include a connecting member configured to be received within a receiving space of a server device. The connecting member can also facilitate the rotation of the lever structure.

In some embodiments, the connector member can include a securing element configured to interlock within an aperture of the fan guard structure. In some embodiments, the connector member can include a gripping region configured to receive a force to turn the connector member and the securing element simultaneously between a locked and an unlocked position. In some embodiments, the fan guard structure, the lever structure, and the connector member can have a combined thickness of less than 30 mm when in the engaged position.

Additional features and advantages of the disclosure will be set forth in the description that follows, and in part, will be obvious from the description; or can be learned by practice of the principles disclosed herein. The features and advantages of the disclosure can be realized and obtained by means of the instruments and combinations particularly pointed out in the appended claims. These and other features of the disclosure will become fully apparent from the following description and appended claims, or can be learned by the practice of the principles set forth herein.

BRIEF DESCRIPTION OF THE DRAWINGS

In order to describe the manner in which the above-recited and other advantages and features of the disclosure can be obtained, a more particular description of the principles described above will be rendered by reference to specific examples illustrated in the appended drawings. These drawings depict only example aspects of the disclosure, and are therefore not to be considered as limiting of its scope The principles are described and explained with additional specificity and detail through the use of the following drawings.

DETAILED DESCRIPTION

Figure 1:
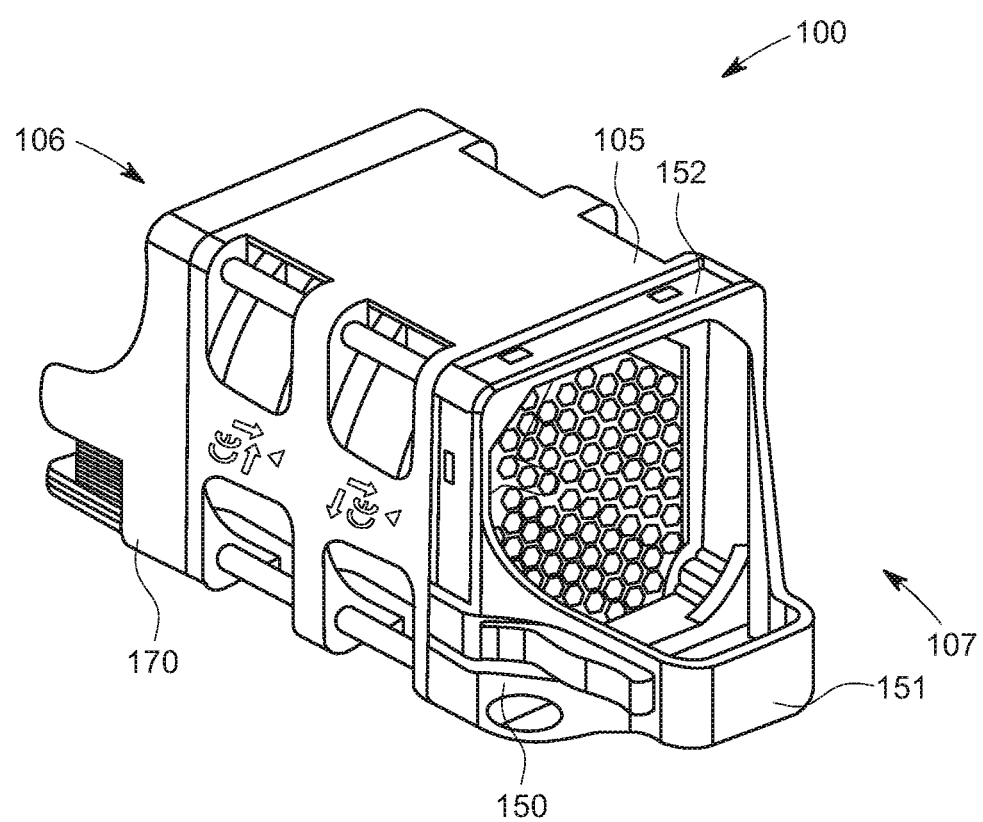
FIG. 1 illustrates an isometric view of a conventional cooling system of the prior art.

The present invention is described with reference to the attached figures, where like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A fan guard connector is provided. The fan guard connector includes a fan guard structure configured to be secured to a cooling system. The fan guard connector also includes a lever structure connected to the fan guard structure by a pivot element. The lever structure is configured to rotate between an engaged and a disengaged position. The fan guard connector also includes a connector member configured to secure the lever structure to the fan guard structure in the engaged position.

FIG. 1 illustrates an isometric view of a conventional cooling system 100, as known in the prior art. The cooling system 100 can include a housing 105 with a proximal end 107 and a distal end 106. The housing 105 can include an inlet fan guard connector 150 at the proximal end 107, and an outlet fan guard connector 170 at the distal end 106 of the housing 105. The inlet fan guard connector 150 can include an attachment element 152. The attachment element 152 is configured to secure the inlet fan guard connector 150 to the housing 105. The inlet fan guard connector 150 can have a protruding element 151 that extends from the housing 105. The protruding element 151 can be implemented as a handle device. An administrator can remove or insert the cooling system 100 into a server device (not shown) using the protruding element 151.

Figure 2:
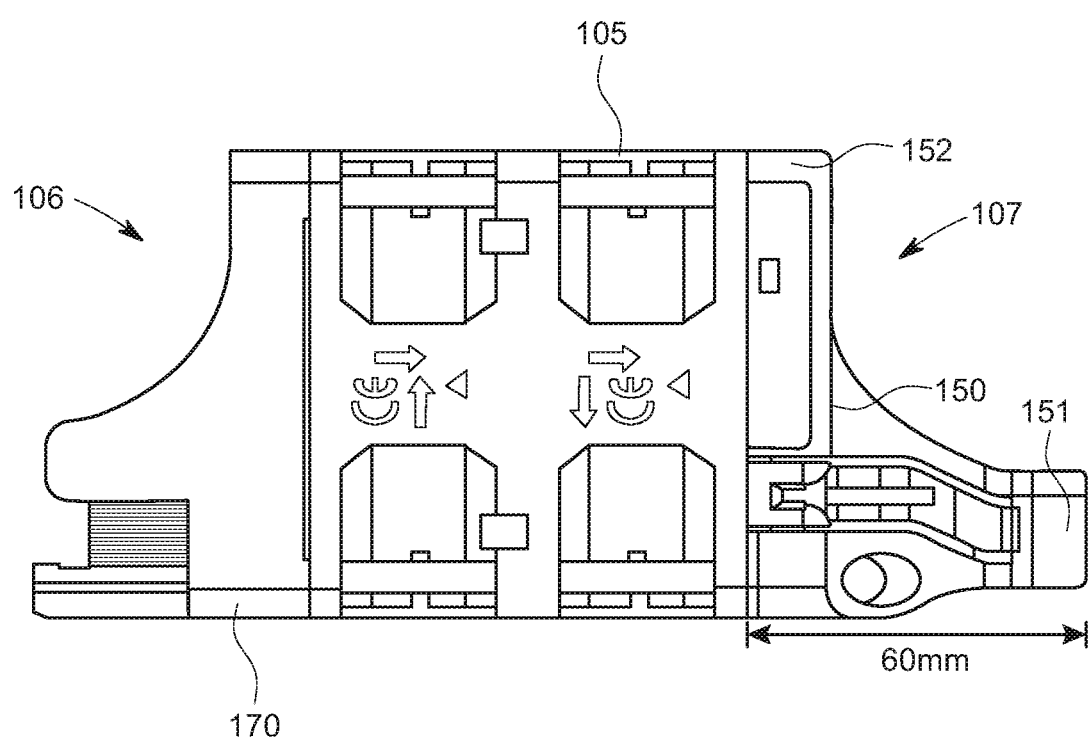
FIG. 2 illustrates a side view of the conventional cooling system of FIG. 1.

FIG. 2 illustrates a side view of the exemplary conventional cooling system 100. The inlet fan guard connector 150 can extend a significant distance from the housing 105. In some typical examples, the inlet fan guard connector 150 can extend 60 mm from the housing 105. This length provides significant length to the cooling system 100. As described above, a typical chassis (not shown) can house a finite number of the cooling systems 100. A more compact design will provide an ability to add more cooling systems within the limited available space within the chassis. A more compact design can also provide more space to house more electronic components within the chassis as well.

Figure 3A:
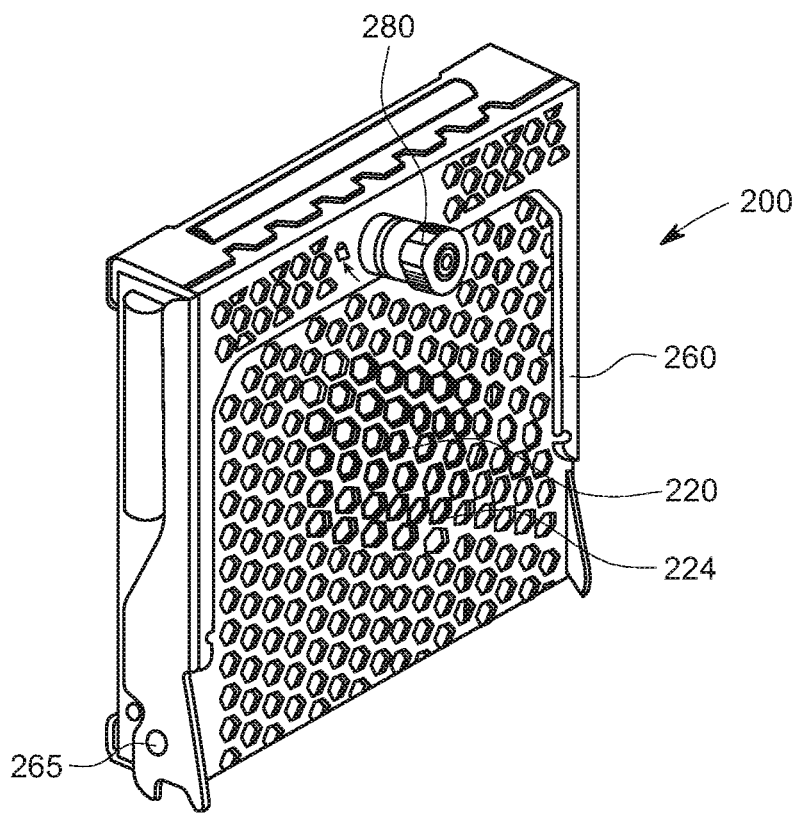
FIG. 3A illustrates an isometric view of a fan guard connector, in accordance with an embodiment of the disclosure.
Figure 3B:
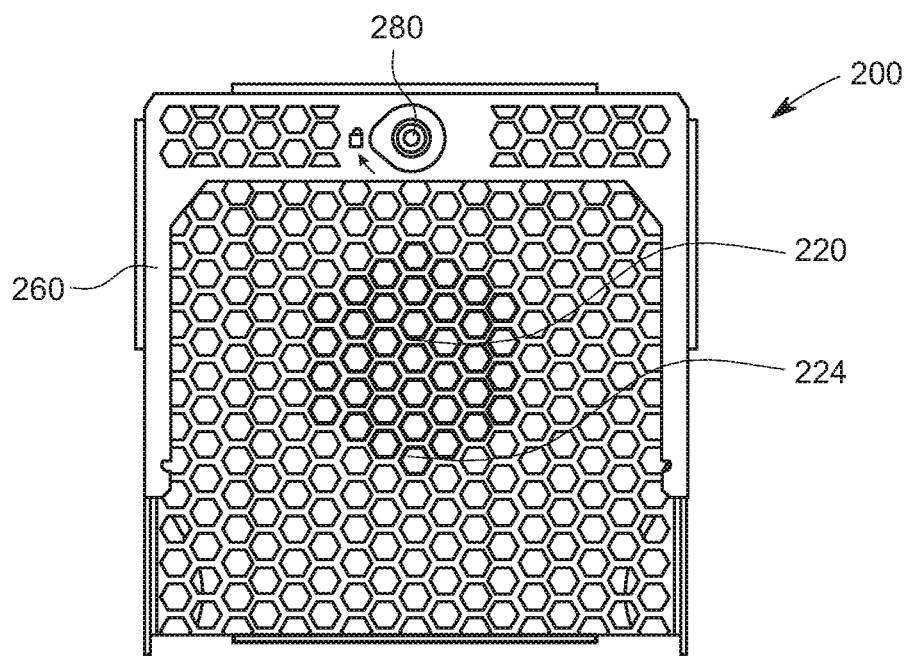
FIG. 3B illustrates a front view of a fan guard connector, in accordance with an embodiment of the disclosure.

FIGS. 3A and 3B illustrates an isometric view and a front view of a fan guard connector 200, respectively. The fan guard connector 200 can be configured as an inlet or an outlet guard connector as discussed above. The fan guard connector 200 can include a fan guard 220, a lever structure 260, and a connector member 280. The connector member 280 can be configured as a turning mechanism. The fan guard 220 can be constructed as a cage structure with a protruding feature 224. The protruding feature 224 can be designed to provide clearance for a spinner fairing of the internal fans (not shown). The lever structure 260 can be configured to rotate between an engaged or a disengaged position about a pivot element 265. The lever structure 260 can be implemented as a handle device in the disengaged position. The connector member 280 can be configured to secure the lever structure 260 in an engaged position. In some embodiments, the connector member 280 can be a quarter-turn screw that turns between a locked and an-locked position. This is discussed in greater detail below with respect to FIGS. 5A and 5B. When the connector member 280 is in the locked position, the lever structure 260 is secured in the engaged position. When the connector member 280 is in the unlocked position, the quarter-turn screw enables free movement of the lever structure 260 between the engaged and disengaged positions. This is discussed in greater detail below with respect to FIGS. 7A, 7B and 7C. The lever structure 260 can be implemented as a handle device. In some embodiments, an administrator can remove or insert the cooling system 200 into a server device (not shown) using the lever structure 260.

Figure 4A:
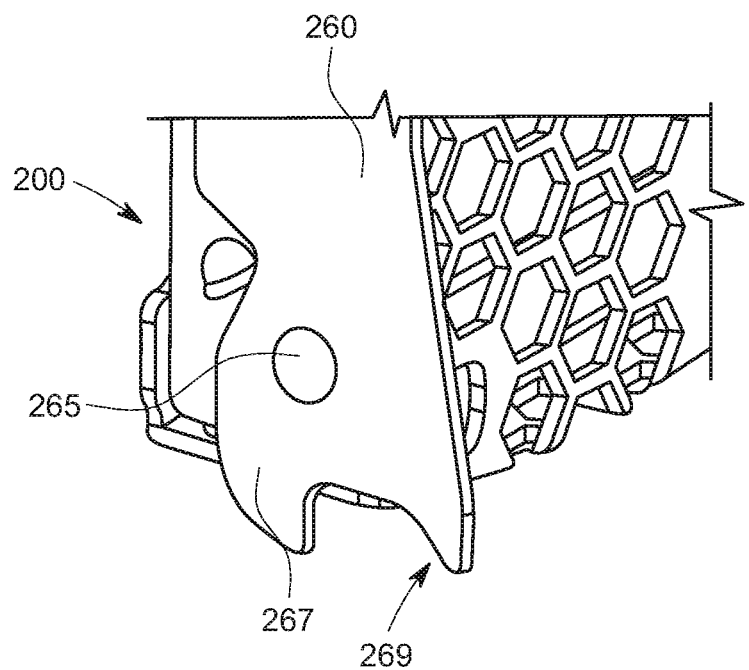
FIGS. 4A and 4B illustrates a pivot element of the fan guard connector of FIG. 3A, in accordance with an embodiment of the disclosure.
Figure 4B:
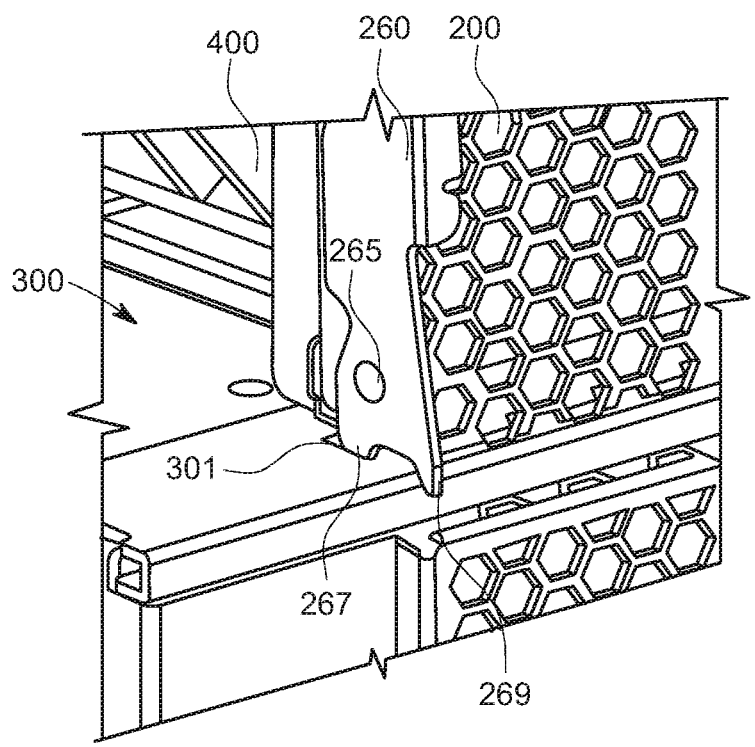

FIGS. 4A and 4B illustrates the pivot element 265 of the fan guard connector 200. The lever structure 260 can include a first connecting hook 267 and a second connecting hook 269. Referring specifically to FIG. 4B, the fan guard connector 200 is shown mounted on a cooling system 400. The cooling system 400 is mounted within a server device 300, which has a receiving space 301. The first connecting hook 267 can be received within the receiving space 301 of the server device 300. The tapered shape of the first connecting hook 267 enables the rotation of the lever structure 260 with respect to the fan guard connector 200. The tapered shape of the first connecting hook 267 can also facilitate connection of the cooling system 400 within the server device 300. Thus, in the engaged position. the lever structure 260 engages with the server device 300 to secure the cooling system 400 in place.

Figure 5A:
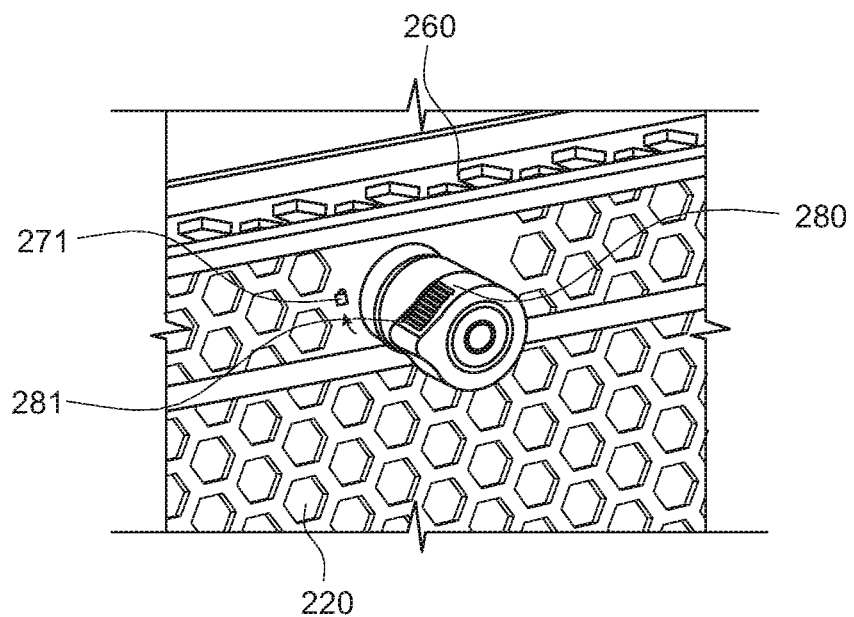
FIG. 5A illustrates a front view of a connector element, in accordance with an embodiment of the disclosure.
Figure 5B:
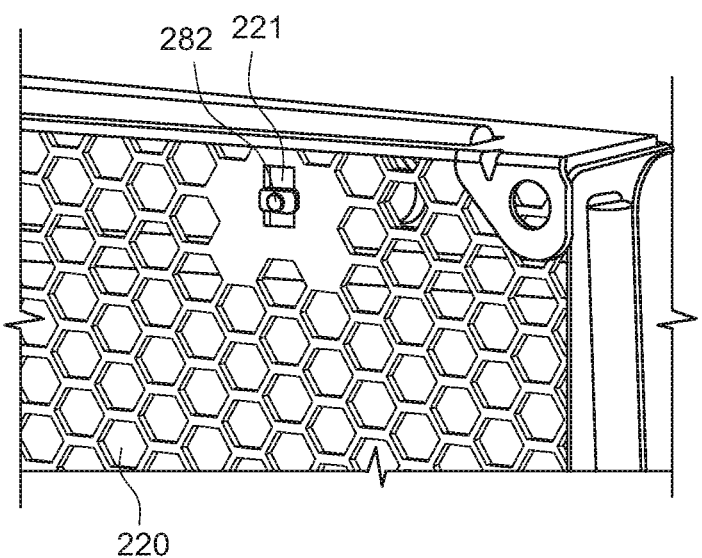
FIG. 5B illustrates a rear view of the connector element of FIG. 5A, in accordance with an embodiment of the disclosure.

FIGS. 5A and 5B illustrates the connector member 280 of the fan guard connector 200. As illustrated above, the connector member 280 can be rotated between a locked and an unlocked position. FIG. 5A illustrates the lever structure 260 can have an indicator 271 of the locked position and the direction the connector member 280 can be turned to access the locked position. The connector member 280 can include a gripping region 281. The gripping region 281 can be configured to receive a force to the turn the connector member 280 between the locked and the unlocked position.

Referring momentarily to FIG. 5B, the rear side of the fan guard connector 200 is illustrated. The connector member 280 (shown in FIG. 5A) can include a securing element 282. The fan guard 220 can include an aperture 221 configured to receive the securing element 282. Both the aperture 221 and the securing element 282 can have the same shape, where the securing element 282 has slightly smaller dimensions to allow it to pass through the aperture 221. The gripping region 281 can be configured to rotate with the connector member 280 (shown in FIG. 5A). The securing element 282 is shown in the locked position in FIG. 5B. Upon turning the connector member 280, the securing element 282 will turn simultaneously, enabling it to pass through the aperture 221 and disengage the lever structure 260. As described above, when the connector member 280 is in the unlocked position, the lever structure 260 is configured to rotate between an engaged and a disengaged position.

Figure 6:
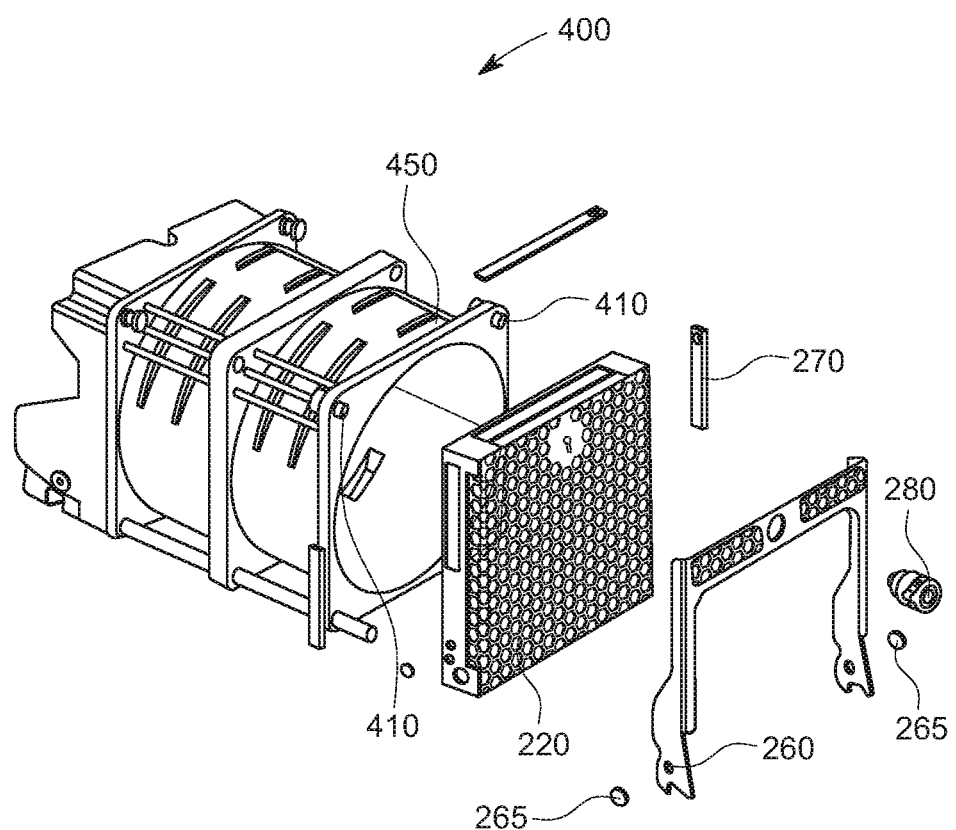
FIG. 6 illustrates an exploded view of a cooling system with the components of the fan guard connector, in accordance with an embodiment of the disclosure.

FIG. 6 illustrates an exploded view of the cooling system 400 with the components of the fan guard connector 200. The cooling system 400 can include a housing 450. As illustrated herein, the fan guard 220 can connect directly to the housing 450 of the cooling system 400. Specifically, the fan guard 220 can receive securing elements 410 to secure it to the housing 450. The securing elements 410 can be a screw device with threading. The fan guard 220 can include corresponding apertures (not shown), each with threading configured to receive the screw device. The lever structure 260 can be connected to the fan guard 220 by the pivot element 265. In some embodiments, the pivot element 265 can include a hinge element or a rivet element.

A rivet element can be implemented as a simple, economical and permanent way to bind two or more sheets of metal together. While the hinge can be implemented to include all of the rivet's function, while allowing an angle of rotation between them. Furthermore, conductive EMI gaskets 270 can be implemented to seal seams in electronic enclosures and airframes against leakage of electromagnetic radiation.

Figure 7A:
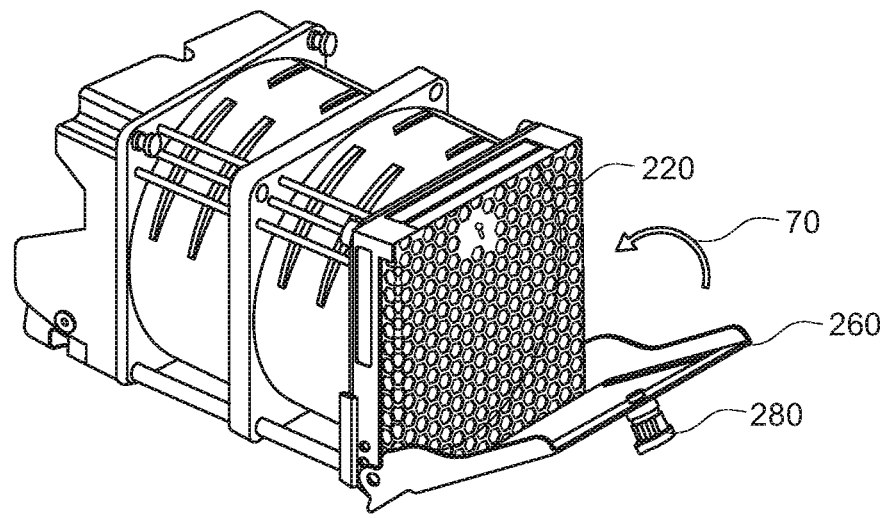
FIG. 7A illustrates a first force applied to disengage the fan guard connector, in accordance with an embodiment of the disclosure.
Figure 7B:
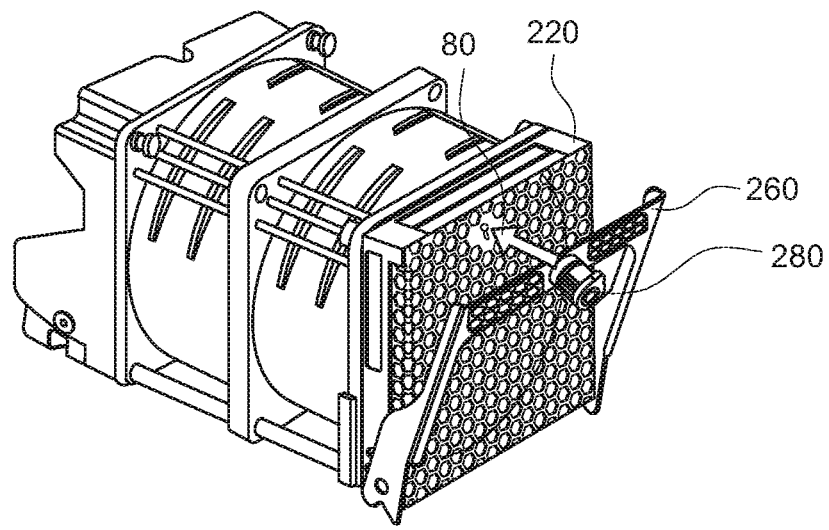
FIG. 7B illustrates a second force applied to engage the fan guard connector, in accordance with an embodiment of the disclosure.
Figure 7C:
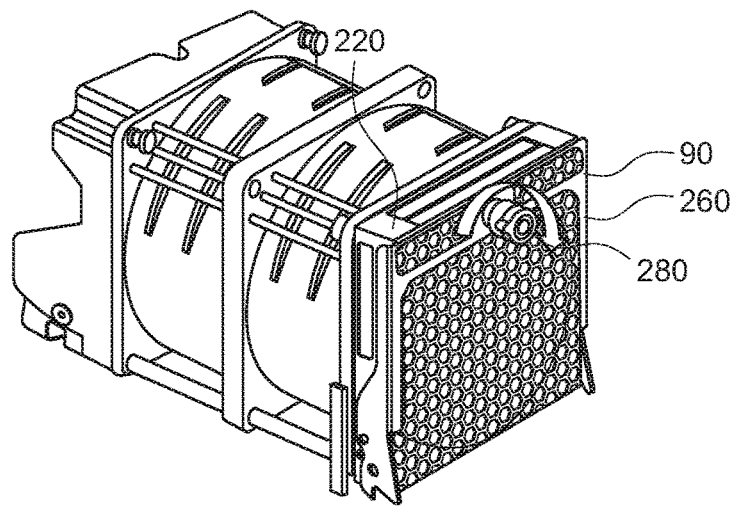
FIG. 7C illustrates a third force applied to secure the lever structure to the fan guard, in accordance with an embodiment of the disclosure.

Now turning to FIGS. 7A-7C, operation of the fan guard 220, the lever structure 260, and the connector element will be described. FIG. 7A illustrates a first force 70 applied to disengage the fan guard connector 200. The first force 70 can be applied to the connector member 280. Once disengaged, the fan guard connector 200 can be re-engaged by pushing the lever structure 260 towards the fan guard 220. FIG. 7B illustrates a second force 80 applied to engage the fan guard connector 200. Once the fan guard connector 200 is in the engaged position, the lever structure 260 can be secured to the fan guard 220 by rotating the connector member 280. This process is described in greater detail above with respect to FIGS. 5A and 5B. FIG. 7C illustrates a third force 90 applied to secure the lever structure 260 to the fan guard 220.

Figure 8:
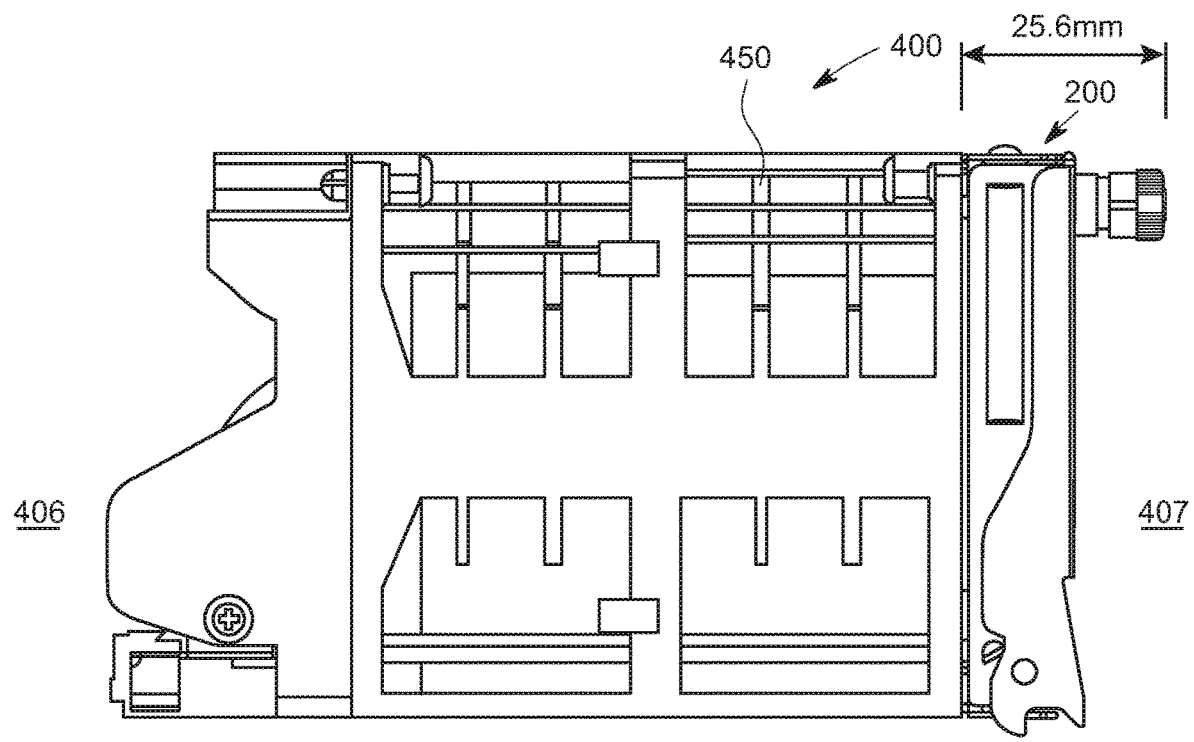
FIG. 8 illustrates a side view of an exemplary conventional cooling system, in accordance with an embodiment of the disclosure.

FIG. 8 illustrates a side view of an exemplary conventional cooling system 400. The cooling system 400 can include the housing 450 with a proximal end 407 and a distal end 406. The housing 450 can include the fan guard connector 200 at the proximal end 407. The fan guard connector 200 can extend a significantly less distance from the housing 450, in comparison to the conventional cooling system 100 of FIG. 1. In some embodiments, the inlet fan guard connector 200 can extend less than 30 mm from the housing 450. In the specific embodiment illustrated in FIG. 8, the fan guard connector 200 can extend 25.6 mm from the housing 450. In this case, the fan guard connector 200 can extend less than half the distance of the conventional inlet fan guard connector 150 of FIG. 1. With a considerable amount of space savings, a server device can include a greater number of cooling systems 200 within the limited available space. A more compact design can also provide an ability to provide more electronic components within the server device.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The terminology used herein is for the purpose of describing particular embodiments only and is not intended to limit the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A fan guard connector comprising:
    a fan guard structure configured to be secured to an end of a cooling system mountable in a chassis of a computing device, the fan guard structure having a first end opposite a second end, the first end of the fan guard structure securable to the end of the cooling system such that the first end rests between second end and the cooling system, the fan guard structure having a plurality of fan guard apertures permitting airflow through the fan guard structure;
    a lever structure connected to the fan guard structure by a pivot element, wherein the lever structure is configured to rotate between an engaged and a disengaged position, wherein the lever structure extends from the pivot element towards a top of the fan guard structure, wherein the lever does not extend past the top of the fan guard structure, wherein the lever structure includes a plurality of lever structure apertures, and wherein each of the plurality of lever structure apertures is aligned with respective ones of the plurality of fan guard apertures when the lever structure is in the engaged position to permit airflow through the fan guard structure and the lever structure; and
    a connector member configured to secure the lever structure to the fan guard structure in the engaged position.

2. The fan guard connector of claim 1, wherein the fan guard structure comprises a protruding element configured to provide clearance for a spinner fairing of the cooling system.

3. The fan guard connector of claim 1, wherein the connector member comprises a turning mechanism that is configured to posture between a locked and an unlocked position.

4. The fan guard connector of claim 3, wherein when the lever structure is in the engaged position, the turning mechanism is in the locked position.

5. The fan guard connector of claim 1, wherein the lever structure further comprises a connecting member that is configured to be received within a receiving space of the chassis and facilitate mounting the cooling system within the chassis of the computing device.

6. The fan guard connector of claim 1, wherein the connector member comprises a securing element configured to interlock within an aperture of the fan guard structure, and wherein the connector member comprises a gripping region configured to receive a force to turn the connector member and the securing element simultaneously between a locked and an unlocked position.

7. The fan guard connector of claim 1, wherein the lever structure is implemented as a handle to facilitate removal or insertion of the cooling system with respect to the chassis.

8. The fan guard connector of claim 1, wherein the fan guard structure comprises a cage structure for covering an inlet side or an outlet side of the cooling system.

9. The fan guard connector of claim 1, wherein the pivot element is positioned such that rotation of the lever structure from the disengaged position to the engaged position includes continuously moving the lever structure towards the second end of the fan guard.

10. The fan guard connector of claim 1, wherein the fan guard structure, the lever structure, and the connector member comprises a thickness of less than 30 mm when the lever structure is in the engaged position.

11. A cooling assembly comprising:
a fan module housing mountable in a chassis of a computing device;
an inlet side and an outlet side of the fan module housing; and
a fan guard connector attached to one or more of the inlet side or the outlet side of the fan module housing, the fan guard connector comprising
a fan guard structure configured to be secured to an end of the fan module housing, the end of the fan module housing located at the inlet side or the outlet side, the fan guard structure having a first end opposite a second end, the first end of the fan guard structure securable to the end of the fan module housing such that the first end rests between second end and the fan module housing, the fan guard structure having a plurality of fan guard apertures permitting airflow through the fan guard structure;
a lever structure connected to the fan guard structure by a pivot element, wherein the lever structure is configured to rotate between an engaged and a disengaged position, wherein the lever structure extends from the pivot element towards a top of the fan guard structure, wherein the lever does not extend past the top of the fan guard structure, wherein the lever structure includes a plurality of lever structure apertures, and wherein each of the plurality of lever structure apertures is aligned with respective ones of the plurality of fan guard apertures when the lever structure is in the engaged position to permit airflow through the fan guard structure and the lever structure; and
a connector member configured to secure the lever structure to the fan guard structure in the engaged position.

12. The cooling assembly of claim 11, wherein the fan guard structure comprises a protruding element configured to provide clearance for a spinner fairing of the fan module housing.

13. The cooling assembly of claim 11, wherein the connector member comprises a turning mechanism that is configured to posture between a locked and an unlocked position.

14. The cooling assembly of claim 13, wherein when the lever structure is in the engaged position, the turning mechanism is in the locked position.

15. The cooling assembly of claim 11, wherein the lever structure further comprises a connecting member configured to be received within a receiving space of the chassis and facilitate mounting the fan module housing within the chassis of the computing device.

16. The cooling assembly of claim 11, wherein the connector member comprises a securing element configured to interlock within an aperture of the fan guard structure, and wherein the connector member comprises a gripping region configured to receive a force to turn the connector member and the securing element simultaneously between a locked and an unlocked position.

17. The cooling assembly of claim 11, wherein the fan guard structure, the lever structure, the connector member comprises a thickness of less than 30 mm when in the engaged position.

18. The cooling assembly of claim 16, wherein the lever structure is implemented as a handle to facilitate removal or insertion of the fam module housing with respect to the chassis.

19. The cooling assembly of claim 16, wherein the fan guard structure comprises a cage structure for covering the inlet side or the outlet side of the fan module housing.

20. The cooling assembly of claim 11, wherein the pivot element is positioned such that rotation of the lever structure from the disengaged position to the engaged position includes continuously moving the lever structure towards the second end of the fan guard.

* * * * *